(12) United States Patent
Okuda

(10) Patent No.: US 11,320,473 B2
(45) Date of Patent: May 3, 2022

(54) CAPACITANCE DETECTION DEVICE AND OPTICAL WAVELENGTH-SELECTIVE FILTER DEVICE

(71) Applicant: PIONEER CORPORATION, Tokyo (JP)

(72) Inventor: Yoshiyuki Okuda, Kawagoe (JP)

(73) Assignee: PIONEER CORPORATION, Tokyo (JP)

( * ) Notice: Subject to any disclaimer, the term of this patent is extended or adjusted under 35 U.S.C. 154(b) by 742 days.

(21) Appl. No.: 16/325,893

(22) PCT Filed: Aug. 22, 2016

(86) PCT No.: PCT/JP2016/074410
§ 371 (c)(1),
(2) Date: Feb. 15, 2019

(87) PCT Pub. No.: WO2018/037463
PCT Pub. Date: Mar. 1, 2018

(65) Prior Publication Data
US 2019/0219622 A1 Jul. 18, 2019

(51) Int. Cl.
*G02B 27/00* (2006.01)
*G01R 27/26* (2006.01)
*G02B 5/28* (2006.01)

(52) U.S. Cl.
CPC ......... *G01R 27/2605* (2013.01); *G01R 27/26* (2013.01); *G02B 5/284* (2013.01)

(58) Field of Classification Search
CPC ...... G01R 27/2605; G01R 27/26; H03N 7/17; H03N 7/1708; H03N 7/1741; H03N 7/18;
(Continued)

(56) References Cited

U.S. PATENT DOCUMENTS 3,852,662 A * 12/1974 Katz ...................... G01B 7/023
324/662
5,150,062 A 9/1992 Takeuchi
(Continued)

FOREIGN PATENT DOCUMENTS

EP   3 037 854 A1   6/2016
GB   629279 A      9/1949
(Continued)

OTHER PUBLICATIONS

Paolo Mantenuto, Andrea De Marcellis, Giuseppe Ferri, "Novel Modified De-Sauty Autobalancing Bridge-Based Analog Interfaces for Wide-Range Capacitive Sensor Applications", IEEE Sensors Journal, May 2014, vol. 14, No. 5, pp. 1664-1672.
International Search Report, dated Nov. 15, 201, from corresponding PCT/JP2016/074410 application.

*Primary Examiner* — Arnel C Lavarias
(74) *Attorney, Agent, or Firm* — Nixon & Vanderhye

(57) ABSTRACT

A capacitance detection apparatus is provided with: a parallel circuit in which a first series circuit and a second series circuit are connected in parallel, wherein a tested body and a first resistance element are connected at a first node in the first series circuit, and a reference capacitance element and a second resistance element are connected at a second node in the second series circuit; a power supply circuit configured to apply an alternating current voltage with a specific frequency to the parallel circuit; an inductor element connected between the first node and the second node and configured to increase a phase difference in the voltage with the specific frequency between the first and second nodes; and an output device configured to output an electric signal corresponding to a capacitance of the tested body on the basis of the phase difference.

6 Claims, 12 Drawing Sheets

(58) Field of Classification Search
CPC ...... G02B 5/284; G02B 5/28; G02B 6/29358;
G01J 3/26
USPC ........ 359/578, 577; 356/450, 505, 506, 519;
324/649, 652, 658, 661, 662, 676, 677,
324/679, 686
See application file for complete search history.

(56) References Cited

U.S. PATENT DOCUMENTS

| | | | |
|---|---|---|---|
| 7,385,405 B2* | 6/2008 | Chen | G01R 27/2658 |
| | | | 324/690 |
| 8,253,426 B2* | 8/2012 | Tateishi | G11B 11/08 |
| | | | 324/658 |
| 2013/0176038 A1 | 7/2013 | Wherritt | |
| 2014/0049273 A1 | 2/2014 | Rocznik | |

FOREIGN PATENT DOCUMENTS

| | | | | |
|---|---|---|---|---|
| JP | 45-10463 Y1 | 5/1970 | | |
| JP | 48-27779 A | 4/1973 | | |
| JP | 48-45271 A | 6/1973 | | |
| JP | 62-159054 A | 7/1987 | | |
| JP | 1-94312 A | 4/1989 | | |
| JP | 8-278336 A | 10/1996 | | |
| JP | 09270665 A | * 10/1997 | | |
| JP | 2002-277758 A | 9/2002 | | |
| JP | 2005-066045 A | 3/2005 | | |
| JP | 2008271408 A | * 11/2008 | | |
| JP | 2009-106574 A | 5/2009 | | |
| WO | WO-2005088832 A1 | * 9/2005 | ........... H03H 7/0161 |
| WO | WO-2018230567 A1 | * 12/2018 | ................ G01J 3/26 |
| WO | WO-2019216274 A1 | * 11/2019 | ........... G01D 5/2417 |

* cited by examiner

CAPACITANCE DETECTION DEVICE AND OPTICAL WAVELENGTH-SELECTIVE FILTER DEVICE

TECHNICAL FIELD

The present invention relates to a capacitance detection apparatus configured to detect a capacitance on a circuit, and an optical wavelength selective filter apparatus using the same.

BACKGROUND ART

For this type of apparatus, there is known an apparatus configured to detect an unknown capacitance provided on a circuit. For example, Patent Literature 1 discloses a technology/technique of detecting the capacitance of a variable capacitance element, by respectively applying rectangular wave signals with the same period but different phases, to a series circuit including the variable capacitance element and a resistance element and to a series circuit including a fixed capacitance element as a reference value and a resistance element, by comparing alternating current (AC) signals obtained by a CR time constant on the two series circuits, and by detecting a phase difference between the AC signals.

CITATION LIST

Patent Literature

Patent Literature 1: Japanese Patent Application Laid Open No. 2005-066045
Patent Literature 2: Japanese Patent Application Laid Open No. 2009-106574

SUMMARY OF INVENTION

Technical Problem

The circuits disclosed the Patent Literature 1 are first-order RC low pass filters (LPFs) and the phase difference is thus almost proportional to a delay time constant τ of the circuits. In such a configuration, if there is a small difference between the capacitance of the variable capacitance element and the reference capacitance of the fixed capacitance element, the phase difference may be too small to provide sufficient detection accuracy. In other words, the technology/technique described in the Patent Literature 1 has such a technical problem that the resolution of the capacitance is insufficient.

An example of problems to be solved by the present invention is the aforementioned problem. It is therefore an object of the present invention to provide a capacitance detection apparatus configured to detect a capacitance on a circuit with high accuracy, and an optical wavelength selective filter apparatus.

Solution to Problem

The above object of the present invention can be achieved by a capacitance detection apparatus provided with: a parallel circuit in which a first series circuit and a second series circuit are connected in parallel, wherein a tested body and a first resistance element are connected at a first node in the first series circuit, and a reference capacitance element and a second resistance element are connected at a second node in the second series circuit; a power supply circuit configured to apply an alternating current voltage with a specific frequency to the parallel circuit; an inductor element connected between the first node and the second node and configured to increase a phase difference in the voltage with the specific frequency between the first and second nodes; and an output device configured to output an electric signal corresponding to a capacitance of the tested body on the basis of the phase difference.

The above object of the present invention can be achieved by an optical wavelength selective filter apparatus with a variable extraction wavelength, wherein the optical wavelength selective filter apparatus is configured to output an electric signal corresponding to a capacitance between capacitance detection electrodes, which are respectively placed on a pair of substrates provided with opposing reflective films and which are the tested body, by using the capacitance detection apparatus described above (including its various aspects), and is configured to change a gap between the reflective films on the basis of the electric signal.

DESCRIPTION OF EMBODIMENTS

<1>

Figure 1:
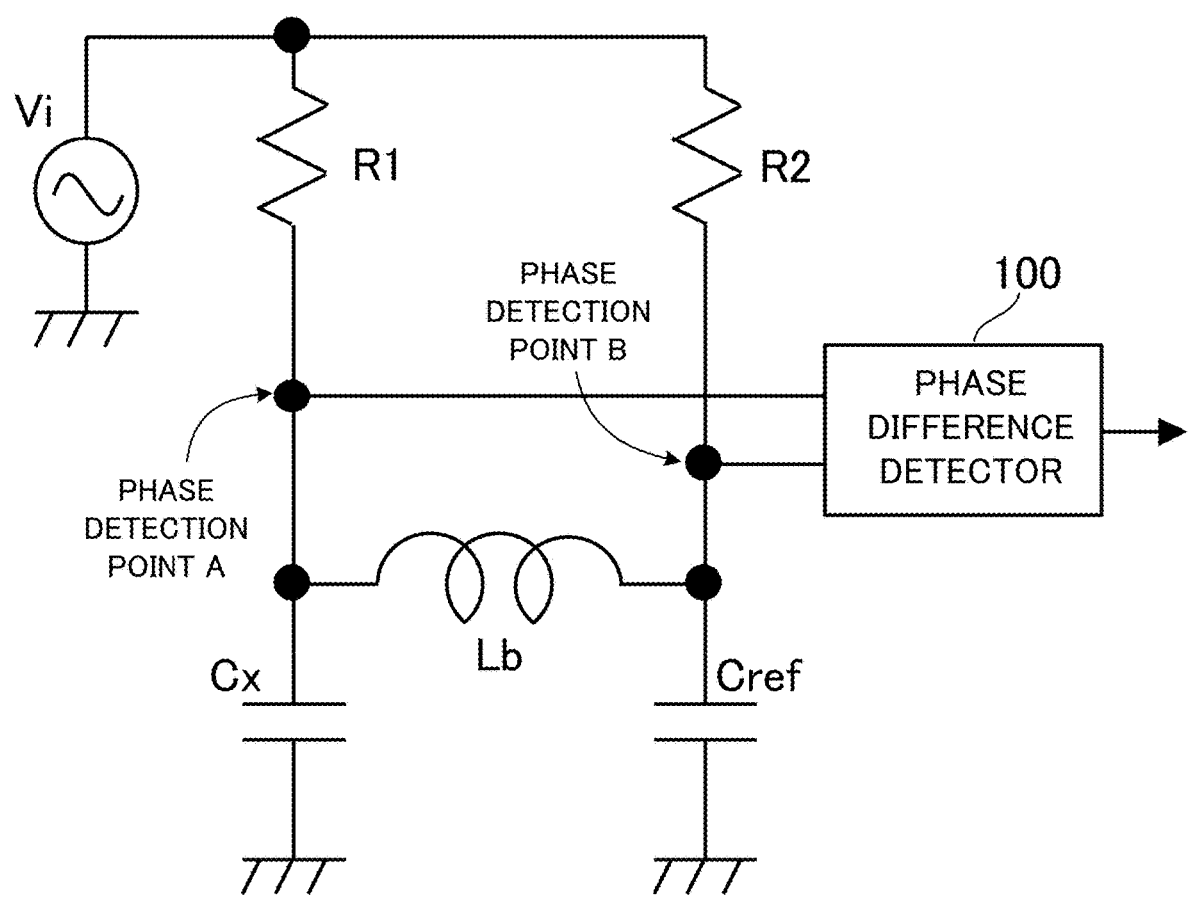
FIG. 1 is a circuit diagram illustrating a configuration of a capacitance detection apparatus according to a practical example.

A capacitance detection apparatus according to an embodiment is provided with: a parallel circuit in which a first series circuit and a second series circuit are connected in parallel, wherein a tested body and a first resistance element are connected at a first node in the first series circuit, and a reference capacitance element and a second resistance element are connected at a second node in the second series circuit; a power supply circuit configured to apply an alternating current voltage with a specific frequency to the parallel circuit; an inductor element connected between the first node and the second node and configured to increase a phase difference in the voltage with the specific frequency between the first and second nodes; and an output device configured to output an electric signal corresponding to a capacitance of the tested body on the basis of the phase difference.

According to the capacitance detection apparatus in the embodiment, the electric signal corresponding to the capacitance of the tested body is outputted on the basis of the phase difference in the voltage with the specific frequency between the first node and the second node. This makes it possible to detect the capacitance of the tested body from the outputted electric signal.

Particularly in the embodiment, the inductor element is connected between the first node and the second node, and the phase difference of the specific frequency between the first and second node is increased. This makes it possible to more accurately detect the magnitude of the phase difference, and to increase the detection accuracy of the capacitance indicated by the electric signal.

The effect of increasing the phase difference can be realized by respectively connecting inductor elements to the first node and the second node. In this case, however, the inductance elements are required to have the same inductance. If there is a difference in the value of the inductance, the difference may adversely influence a detection result.

In the embodiment, however, the inductance element is connected between the first node and the second node. In other words, a single inductor element is connected to each of the first node and the second node. Therefore, there is no difference in the inductance, and a reduction in the detection accuracy can be prevented.

<2>

In another aspect of the capacitance detection apparatus according to the embodiment, the output device is configured to output an electric signal indicating a magnitude correlation between the capacitance of the tested body and a capacitance of the reference capacitance element.

According to this aspect, it is possible to accurately detect the capacitance on the basis of the magnitude correlation between the capacitance of the tested body and the capacitance of the reference capacitance element.

<3>

In another aspect of the capacitance detection apparatus according to the embodiment, the first resistance element and the second resistance element are pure resistors with the same resistance value, the inductor element is a coil element, and the reference capacitance element is a capacitor with a known capacitance.

According to this aspect, it is possible to preferably output the electric signal corresponding to the capacitance of the tested body.

<4>

In another aspect of the capacitance detection apparatus according to the embodiment, the reference capacitance element has a function of varying a value of the capacitance.

According to this aspect, if the capacitance of the tested body varies in a relatively wide range, the capacitance of the reference capacitance element can be changed to have an appropriate value corresponding to the capacitance of the tested body.

<5>

In another aspect of the capacitance detection apparatus according to an embodiment, it is further provided with an active circuit electrically connected in parallel with the tested body and configured to equivalently increase or reduce the capacitance of the tested body connected to the first node.

According to this aspect, it is possible to change the capacitance of the tested body to have a desired value.

<6>

An optical wavelength selective filter apparatus according to the embodiment is an optical wavelength selective filter apparatus with a variable extraction wavelength, wherein the optical wavelength selective filter apparatus is configured to output an electric signal corresponding to a capacitance between capacitance detection electrodes, which are respectively placed on a pair of substrates provided with opposing reflective films and which are the tested body, by using the capacitance detection apparatus described above (including its various aspects), and is configured to change a gap between the reflective films on the basis of the electric signal.

According to the optical wavelength selective filter apparatus in the embodiment, the electric signal corresponding to the capacitance between the capacitance detection electrodes, which are the tested body, is outputted by using the aforementioned capacitance detection apparatus. Here, in particular, the capacitance between the capacitance detection electrodes varies in accordance with the gap between the reflective films. In other words, the capacitance between the capacitance detection electrodes has a value indicating the magnitude of the gap between the reflective films.

It is thus possible to realize a desired gap by changing the gap in accordance with the capacitance indicated by the electric signal. As a result, it is possible to adjust the extraction wavelength to have an appropriate value.

The operation and other advantages of the capacitance detection apparatus and the optical wavelength selective filter apparatus according to the embodiments will be explained in more detail in the following practical example.

Practical Example

Hereinafter, a capacitance detection apparatus and an optical wavelength selective filter apparatus according to a practical example will be explained in detail with reference to the drawings.

<Capacitance Detection Apparatus>

Firstly, the capacitance detection apparatus will be explained. The capacitance detection apparatus according to the practical example is configured, for example, as an apparatus that can detect a capacitance on an optical wavelength selective filter apparatus. The optical wavelength selective filter apparatus is provided, for example, with opposing mirror surfaces with a gap corresponding to an optical wavelength, and is configured to change a transmission wavelength by changing the gap. Now, if an area S of the opposing mirror surfaces is constant, the following equation (1) is established between a gap d and a capacitance C of a capacitor that uses the opposing mirror surfaces as electrodes.

[Equation 1]

$$C = \frac{\varepsilon_0 \times S}{d} \quad (1)$$

It is thus possible to know the value of the gap d of the opposing mirror surfaces if the value of the capacitance C can be detected by using the capacitance detection apparatus. It is therefore possible to adjust the gap d, or to perform similar operations.

The capacitance detection apparatus according to the practical example can be also used for an apparatus that is different from the optical wavelength selective filter apparatus.

(Configuration of Apparatus)

A configuration the capacitance detection apparatus according to the practical example will be explained with reference to FIG. 1. FIG. 1 is a circuit diagram illustrating the configuration of the capacitance detection apparatus according to the practical example.

As illustrated in FIG. 1, in the capacitance detection apparatus according to the practical example, a first-order LPF that is provided with a resistor R1 and a capacitor Cx, and a first-order LPF that is provided with a resistor R2 and a capacitor Cref are connected in parallel.

The resistor R1 and the resistor R2 are an example of the "resistance element" and are configured to have the same resistance value. The capacitor Cx is an example of the "tested body", and has an unknown value of the capacitance. On the other hand, the capacitance Cref is an example of the "reference capacitance", and has a known value of the capacitance.

Between a node that connects the resistor R1 and the capacitor Cx and a node that connects the resistor R2 and the capacitor Cref, an inductor Lb is provided. The inductor Lb is a specific example of the "inductor element".

The two first-order LPFs connected in parallel are configured in such a manner that a signal Vi for detection can be applied thereto. The signal Vi for detection is a sine wave. To a phase detection point A on the node that connects the resistor R1 and the capacitor Cx and to a phase detection point B on the node that connects the resistor R2 and the capacitor Cref, a phase difference detector 100 is connected, and a phase difference may be detected between the phase detection point A and the phase detection point B if the signal Vi for detection is applied.

Figure 2:
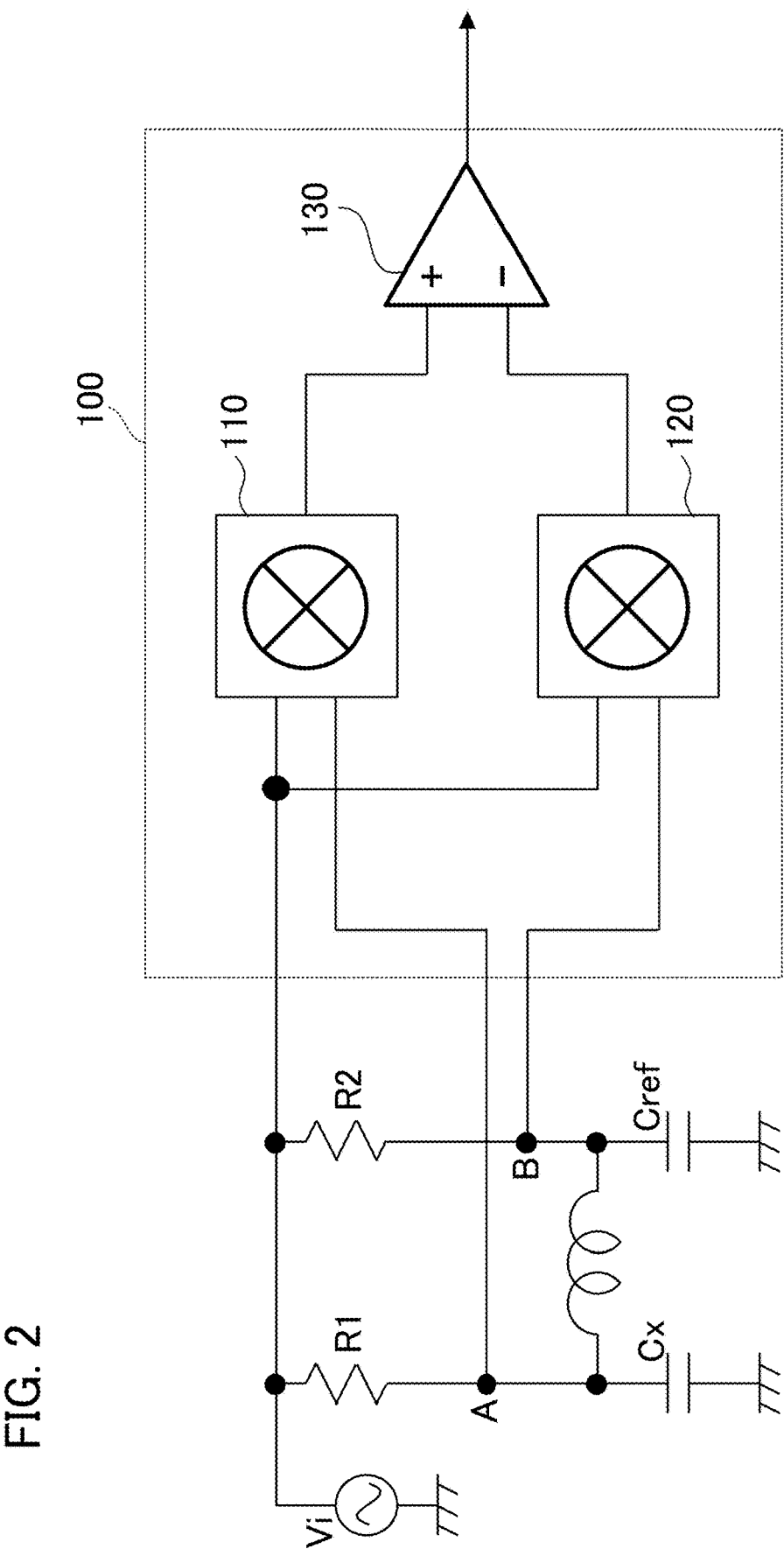
FIG. 2 is a circuit diagram illustrating a configuration of a phase difference detector of the capacitance detection apparatus according to the practical example.

Now, a configuration of the phase difference detector 100 will be explained in detail with reference to FIG. 2. FIG. 2 is a circuit diagram illustrating a configuration of the phase difference detector of the capacitance detection apparatus according to the practical example.

As illustrated in FIG. 2, the phase difference detector 100 is provided with two double balanced mixers (DBMs) 110 and 120 and a differential amplifier 130. By virtue of such a configuration, a phase difference between the signal Vi for detection and a signal VA detected at the phase difference point A is outputted from the DBM 110. On the other hand, a phase difference between the signal Vi for detection and a signal VB detected at the phase difference point B is outputted from the DBM 120. As a result, a phase difference between the signal VA and the signal VB, which is calculated from an output difference between the DBMs 110 and 120, is outputted from the differential amplifier 130.

The aforementioned configuration of the phase difference detector 100 is merely an example, and the configuration is not limited as long as the phase difference between the signal VA and the signal VB can be detected.

(Effect of Practical Example)

Figure 3:
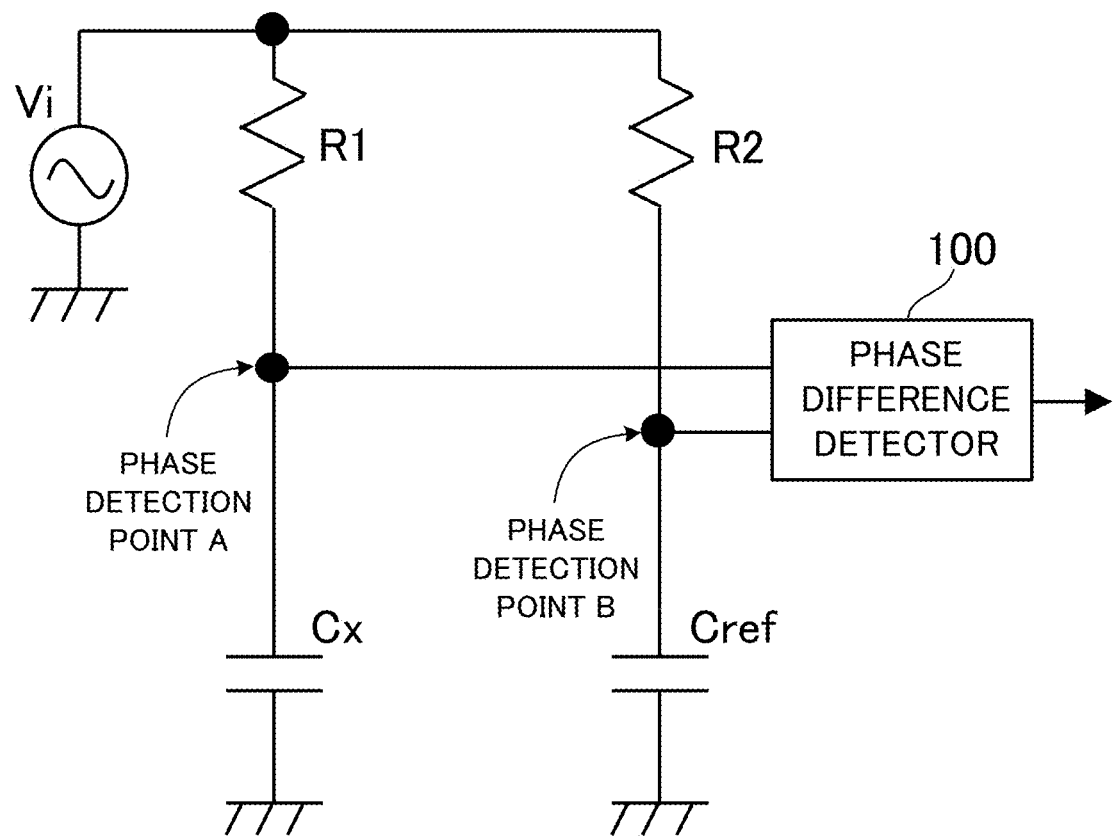
FIG. 3 is a circuit diagram illustrating a configuration of a capacitance detection apparatus according to a first comparative example.
Figure 4:
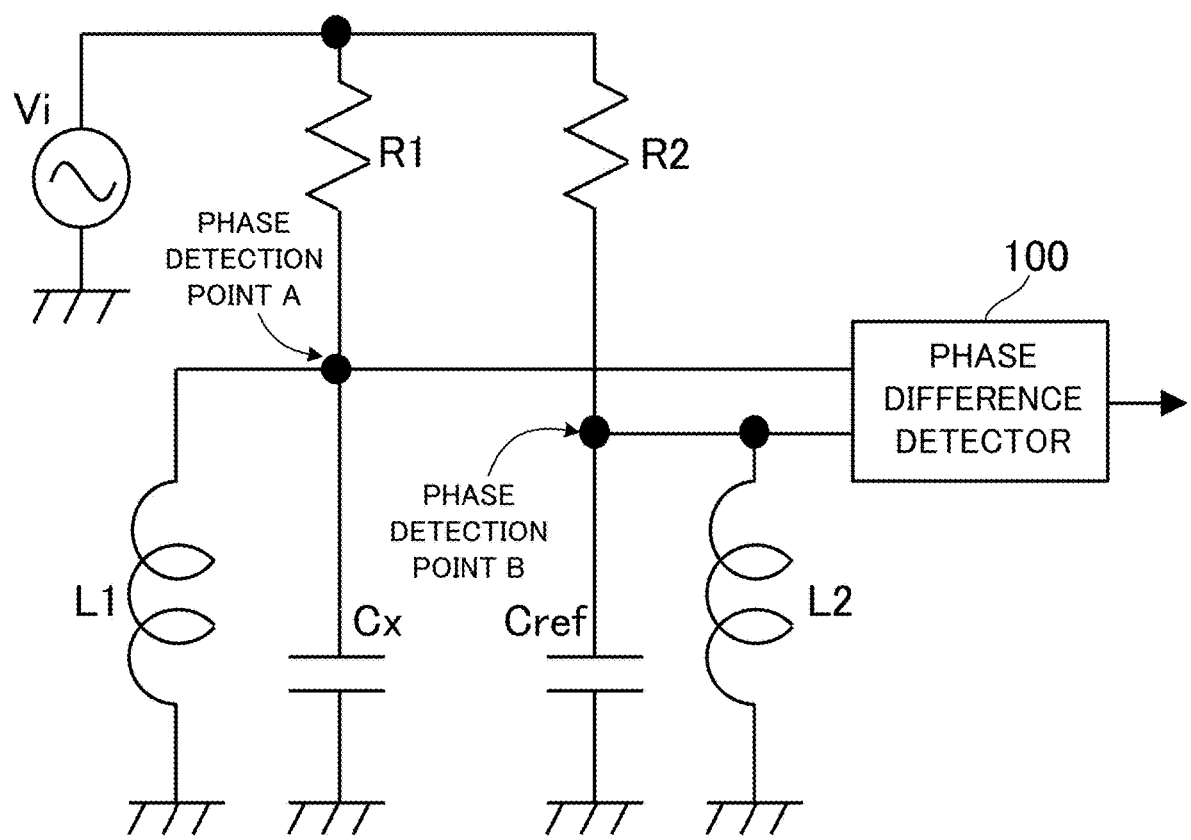
FIG. 4 is a circuit diagram illustrating a configuration of a capacitance detection apparatus according to a second comparative example.

Next, an effect of the capacitance detection apparatus according to the practical example will be explained in view of a difference from comparative examples illustrated in FIG. 3 and FIG. 4. FIG. 3 is a circuit diagram illustrating a configuration of a capacitance detection apparatus according to a first comparative example. FIG. 4 is a circuit diagram illustrating a configuration of a capacitance detection apparatus according to a second comparative example.

As illustrated in FIG. 3, in comparison with the capacitance detection apparatus according to the practical example, the capacitance detection apparatus according to the first comparative example is not provided with the inductor Lb. In the capacitance detection apparatus according to the first comparative example, if the values of Cx and Cref are relatively small, the phase difference may be too small to accurately detect the capacitance. In other words, the capacitance detection apparatus according to the first comparative example possibly has insufficient resolution.

In contrast, in the capacitance detection apparatus according to the practical example, the detected phase difference is increased because the inductor Lb is provided. Specifically, an anti-resonant circuit is formed between the inductor Lb and the capacitors Cx and Cref, by which the detected phase difference is increased. As a result, a phase difference detection sensitivity is increased, and it is possible to accurately detect the value of Cx even if there is only a small difference between Cx and Cref.

As illustrated in FIG. 4, the capacitance detection apparatus according to the second comparative example is provided with inductors L1 and L2, instead of the inductor Lb of the capacitance detection apparatus according to the practical example. In other words, the two inductors are respectively connected to the two first-order LPFs.

According to the capacitance detection apparatus according to the second comparative example, a phase difference detected by the inductors L1 and L2 can be increased. In other words, as in the capacitance detection apparatus according to the practical example, it is possible to increase the phase difference by anti-resonance action.

In such a configuration as in the capacitance detection apparatus according to the second comparative example, however, it is required to set the values of L1 and L2 to be equal to each other. The inductor structurally has difficulty in ensuring numerical accuracy, and there can be variation of about ±10%. If there is a difference between L1 and L2, a detection result cannot be accurate.

In contrast, the capacitance detection apparatus according to the practical example is provided with the common inductor Lb, i.e., only one inductor. Thus, unlike the capacitance detection apparatus according to the second comparative example, there cannot be any difference in the inductance. It is thus possible to extremely accurately detect the capacitance.

(Specific Difference in Phase Difference)

Figure 5:
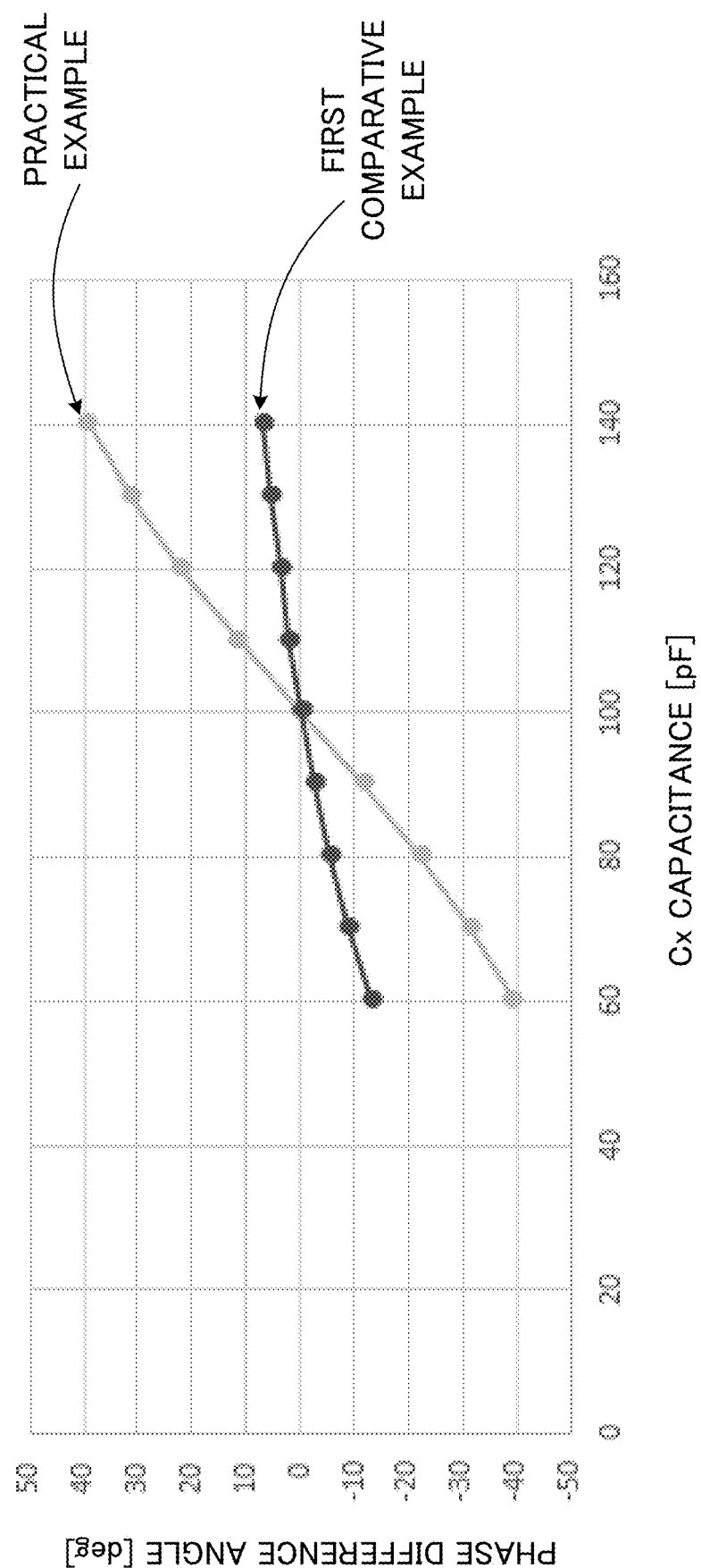
FIG. 5 is a graph illustrating a relation between a capacitance and a phase difference angle detected on each of the capacitance detection apparatuses according to the practical example and the first comparative example.

Next, a difference between the phase difference detected on the capacitance detection apparatus according to the practical example and the phase difference detected on the capacitance detection apparatus according to the first comparative example will be specifically explained with reference to FIG. 5 to FIG. 9. FIG. 5 is a graph illustrating a relation between a capacitance and a phase difference angle detected on each of the capacitance detection apparatuses according to the practical example and the first comparative example. Each of FIG. 6 to FIG. 9 is a graph for comparing frequency characteristics detected in the practical example and the first comparative example.

Transfer functions of the capacitance detection apparatus according to the first comparative example illustrated in FIG. 3 are expressed by the following equations (2) and (3).

[Equation 2]

$$Ha_1(\omega) = \frac{Va_1}{Vi} = \frac{Z_{Cx}}{R_1 + Z_{Cx}} \quad (2)$$

$$Hb_1(\omega) = \frac{Vb_1}{Vi} = \frac{Z_{Cr}}{R_1 + Z_{Cr}} \quad (3)$$

wherein $\omega$ is an angular frequency of the signal Vi for detection, and $Va_1$ and $Vb_1$ are respectively signals detected at the phase difference detection points A and B. Moreover, Z notation ($Z_{Cx}$ and $Z_{Cr}$) in the equations (2) and (3) are respectively the complex impedance of the capacitor Cx and Cref, and are expressed by the following equation (4).

[Equation 3]

$$Z_{Cx} = \frac{1}{j\omega Cx}, Z_{Cr} = \frac{1}{j\omega Cr} \quad (4)$$

If the transfer functions of the equations (2) and (3) are changed to admittance Y notation expressed by the following equation (5), equations (6) and (7) are obtained.

[Equation 4]

$$Y_{R1} = \frac{1}{R_1}, Y_{Cx} = \frac{1}{Z_{Cx}}, Y_{Cr} = \frac{1}{Z_{Cr}} \quad (5)$$

[Equation 5]

$$\frac{Va_1}{Vi} = \frac{Y_{R1}}{Y_{R1} + Y_{Cx}} \quad (6)$$

$$\frac{Vb_1}{Vi} = \frac{Y_{R1}}{Y_{R1} + Y_{Cr}} \quad (7)$$

In this case, a phase angle $\theta a_1$ at the phase difference detection point A and a phase angle $\theta b_1$ at the phase difference detection point B are expressed by the following equations (8) and (9).

[Equation 6]

$$\theta_{a1} = -\tan^{-1}\left\{\frac{im(Ha_1)}{re(Ha_1)}\right\} \quad (8)$$

$$\theta_{b1} = -\tan^{-1}\left\{\frac{im(Hb_1)}{re(Hb_1)}\right\} \quad (9)$$

Therefore, a phase difference $\Delta\theta_1$ detected on the capacitance detection apparatus according to the first comparative example is a value expressed by the following equation (10).

[Equation 7]

$$\Delta\theta_1 = \theta_{a1} - \theta_{b1} \quad (10)$$

Meanwhile, Kirchhoff equations at the phase difference detection points A and B of the capacitance detection apparatus according to the practical example illustrated in FIG. 1 are expressed by the following equations (11) and (12).

[Equation 8]

$$\frac{Vi - Va_2}{R_1} = \frac{Va_2 - Vb_2}{Z_{Lb}} + \frac{Va_2}{Z_{Cx}} \quad (11)$$

$$\frac{Vi - Vb_2}{R_1} = -\frac{Va_2 - Vb_2}{Z_{Lb}} + \frac{Vb_2}{Z_{Cr}} \quad (12)$$

wherein $Va_1$ and $Vb_2$ are respectively signals detected at the phase difference detection points A and B. Moreover, Z notation ($Z_{Lb}$, $Z_{Cx}$ and $Z_{Cr}$) in the equations (11) and (12) are values expressed by the following equations (13) and (14).

[Equation 9]

$$Z_{Lb} = j\omega Lb \quad (13)$$

$$Z_{Cx} = \frac{1}{j\omega Cx}, Z_{Cr} = \frac{1}{j\omega Cr} \quad (14)$$

If the simultaneous equations of the equations (11) and (12) are solved, the following equations (15) and (16) are obtained.

[Equation 10]

$$\frac{1}{R_1}V_i = \left(\frac{1}{R_1} + \frac{1}{Z_{Lb}} + \frac{1}{Z_{Cx}}\right)Va_2 - \frac{1}{Z_{Lb}}Vb_2 \quad (15)$$

$$\frac{1}{R_1}V_i = -\frac{1}{Z_{Lb}}Va_2 + \left(\frac{1}{R_1} + \frac{1}{Z_{Lb}} + \frac{1}{Z_{Cx}}\right)Vb_2 \quad (16)$$

If the equations (15) and (16) are changed to admittance Y notation expressed by the following equation (17) and equations (18), equations (19) and (20) are obtained.

[Equation 11]

$$Y_{R1} = \frac{1}{R_1}, Y_{Lb} = \frac{1}{Z_{Lb}} \quad (17)$$

$$Yx = \frac{1}{R_1} + \frac{1}{Z_{Lb}} + \frac{1}{Z_{Cx}}, Yr = \frac{1}{R_1} + \frac{1}{Z_{Lb}} + \frac{1}{Z_{Cr}} \quad (18)$$

[Equation 12]

$$Y_{R1}V_i = YxVa_2 - Y_{Lb}Vb_2 \quad (19)$$

$$Y_{R1}V_i = -Y_{Lb}Va_2 + YrVb_2 \quad (20)$$

If the simultaneous equations of the equations (19) and (20) are solved, the following equations (21) and (22) are obtained.

[Equation 13]

$$Ha_2(\omega) = \frac{Va_2}{Vi} = \frac{Y_{R1}(Yr + Y_{Lb})}{YxYr - Y_{Lb}^2} \quad (21)$$

$$Hb_2(\omega) = \frac{Vb_1}{Vi} = \frac{Y_{R1}(Y_x + Y_{Lb})}{Y_xY_r - Y_{Lb}^2} \quad (22)$$

In this case, a phase angle $\theta a_2$ at the phase difference detection point A and a phase angle $\theta b_2$ at the phase difference detection point B are expressed by the following equations (23) and (24).

[Equation 14]

$$\theta_{a2} = -\tan^{-1}\left\{\frac{\mathrm{im}(Ha_2)}{\mathrm{re}(Ha_2)}\right\} \quad (23)$$

$$\theta_{b2} = -\tan^{-1}\left\{\frac{\mathrm{im}(Hb_2)}{\mathrm{re}(Hb_2)}\right\} \quad (24)$$

Therefore, a phase difference $\Delta\theta_2$ detected on the capacitance detection apparatus according to the practical example is a value expressed by the following equation (25).

[Equation 15]

$$\Delta\theta_2 = \theta_{a2}\theta_{b2} \quad (25)$$

In FIG. 5, phase difference curves in the first comparative example and the practical example with respect to a change in Cx are calculated by using the transfer functions obtained in the above manner, i.e., the equations (6) and (7) and the equations (21) and (22), while a frequency fi of the signal Vi for detection is fixed. There is a difference as illustrated in FIG. 5.

Specifically, in the example in FIG. 5, measurement is performed in such a condition that Cref=100 pF, Cx=60 to 140 pF, R1=R2=5 kΩ, Lb=1.2 mH, and fi=650 kHz, and the phase difference in the practical example is increased by nearly five times in comparison with the phase difference in the first comparative example. Here, fi=650 kHz is a specific example of the "specific frequency".

Figure 6:
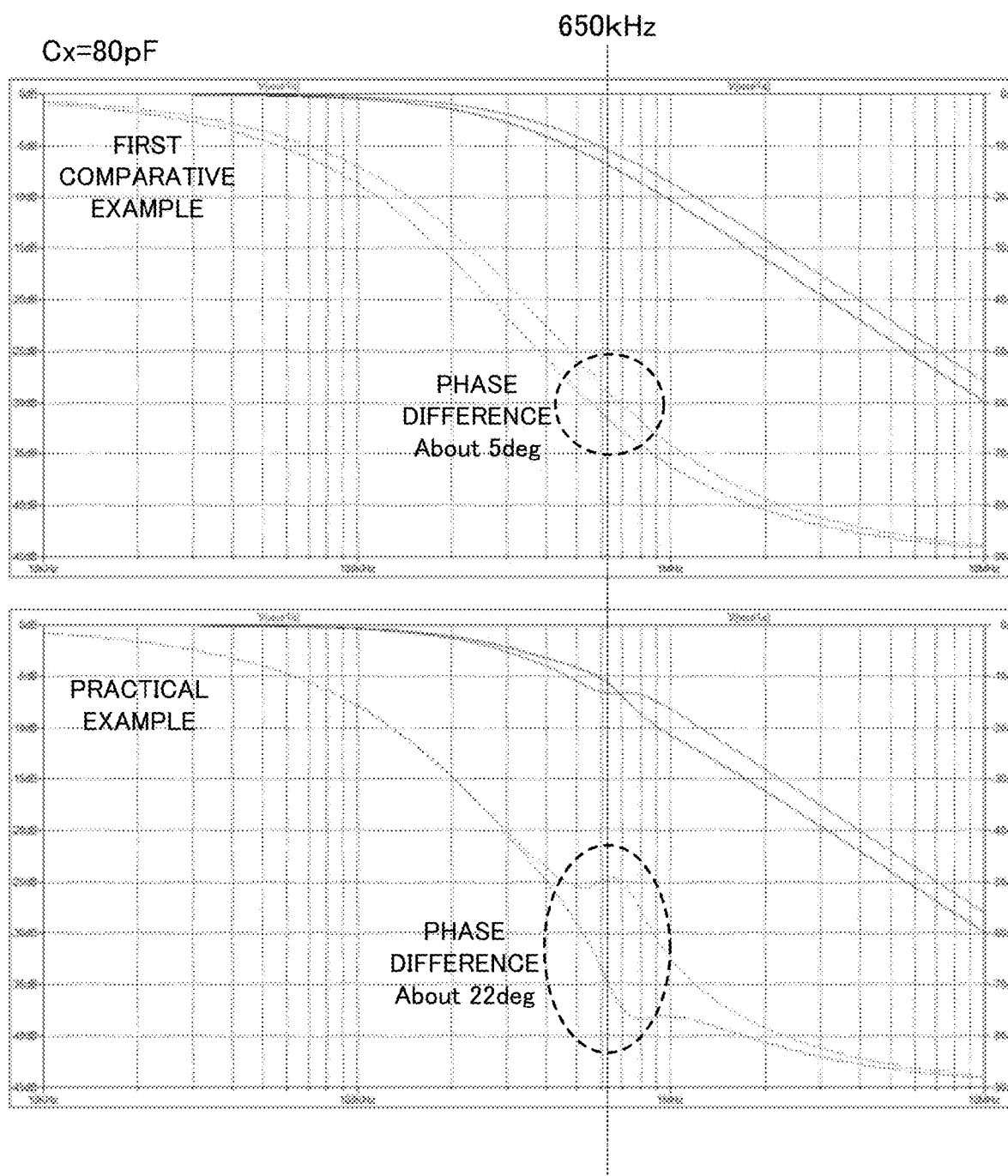
FIG. 6 is version 1 of a graph for comparing frequency characteristics detected in the practical example and the first comparative example.

FIG. 6 illustrates the phase differences of the signals detected in the practical example and the first comparative example when Cx=80 pF. When the frequency fi is 650 kHz, the phase difference detected in the first comparative example is about 5 deg, while the phase difference detected in the practical example is about 22 deg.

Figure 7:
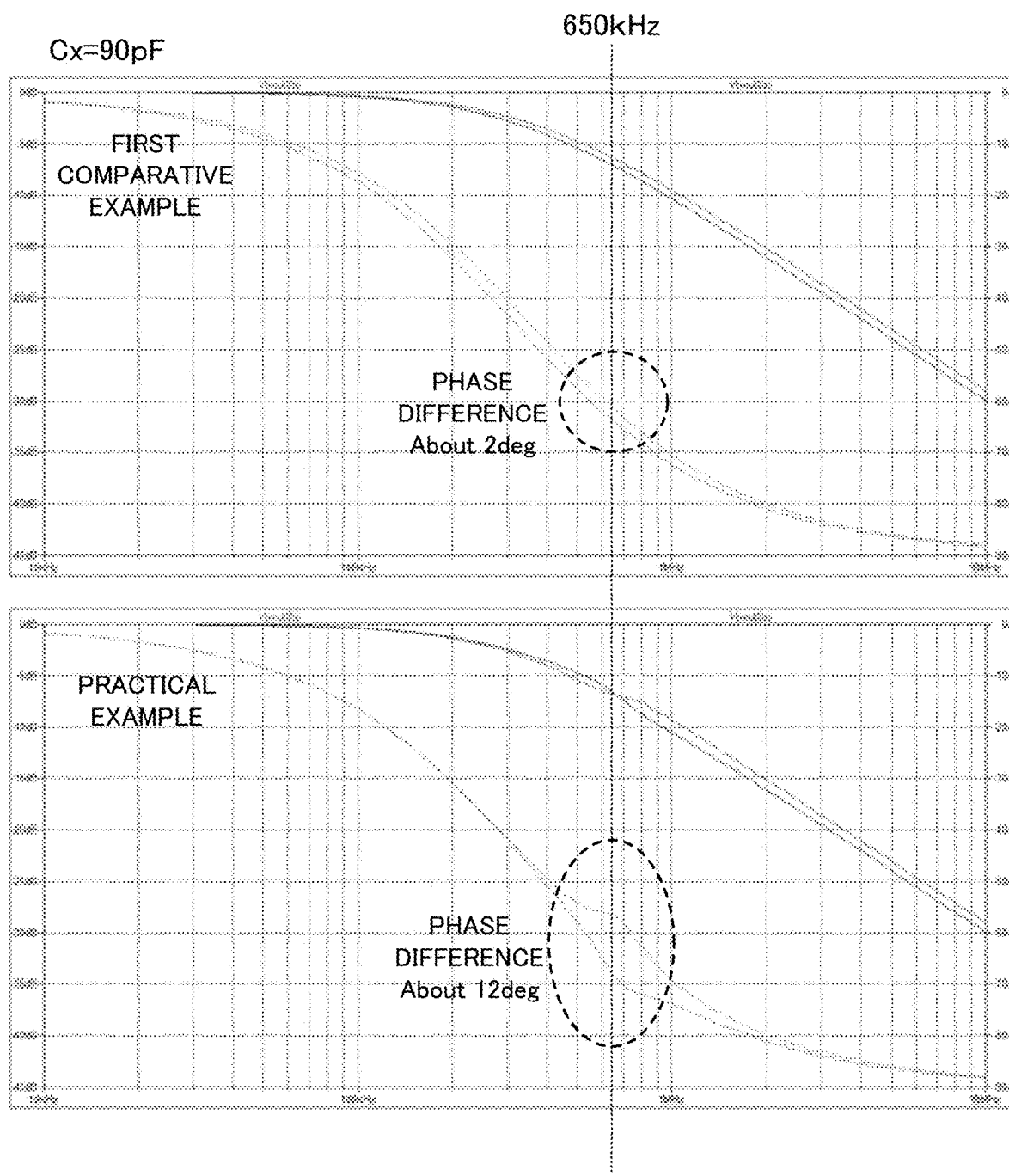
FIG. 7 is version 2 of the graph for comparing frequency characteristics detected in the practical example and the first comparative example.

FIG. 7 illustrates the phase differences of the signals detected in the practical example and the first comparative example when Cx=90 pF. When the frequency fi is 650 kHz, the phase difference detected in the first comparative example is about 2 deg, while the phase difference detected in the practical example is about 12 deg.

Figure 8:
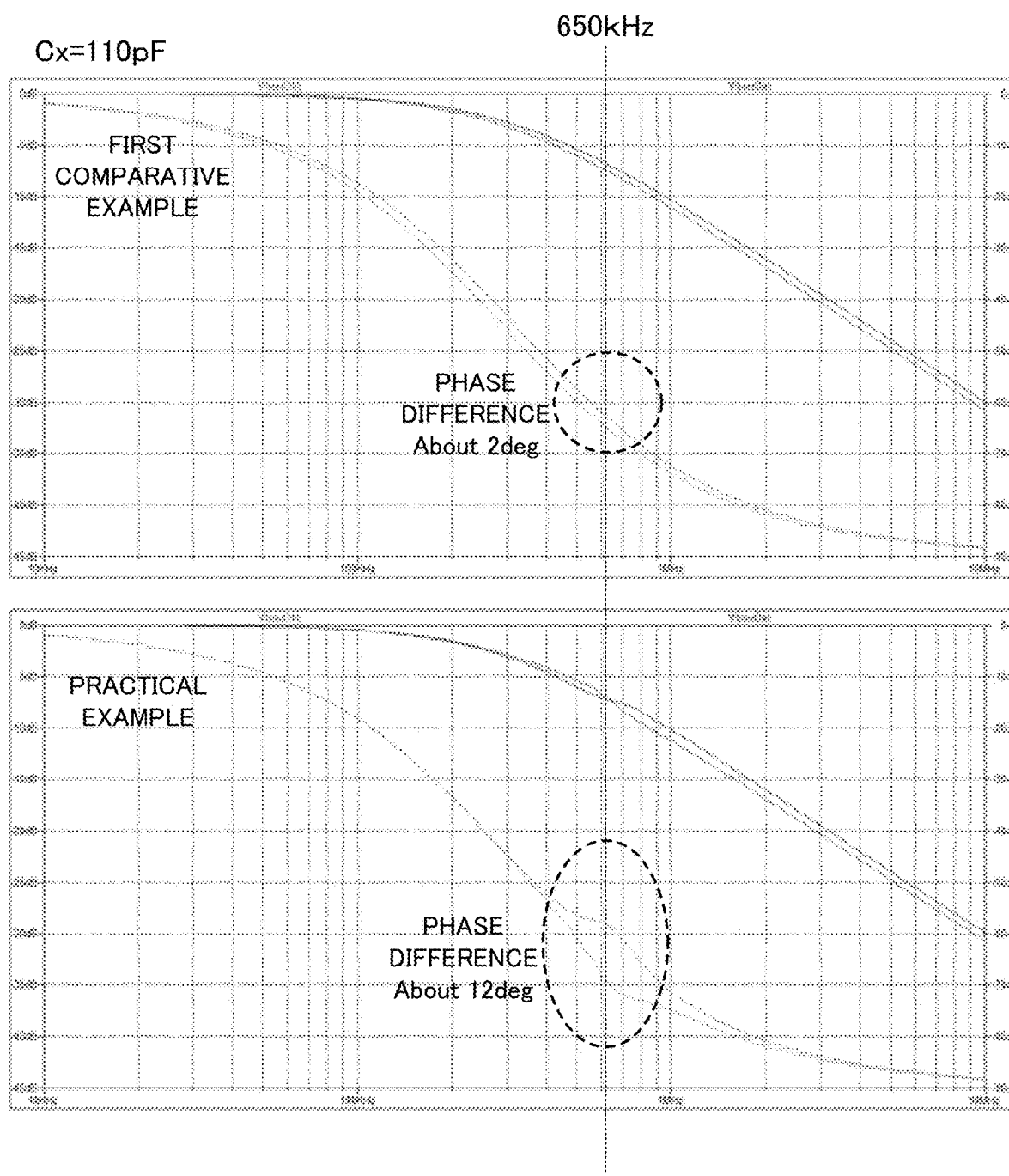
FIG. 8 is version 3 of the graph for comparing frequency characteristics detected in the practical example and the first comparative example.

FIG. 8 illustrates the phase differences of the signals detected in the practical example and the first comparative example when Cx=110 pF. When the frequency fi is 650 kHz, the phase difference detected in the first comparative example is about 2 deg, while the phase difference detected in the practical example is about 12 deg.

Figure 9:
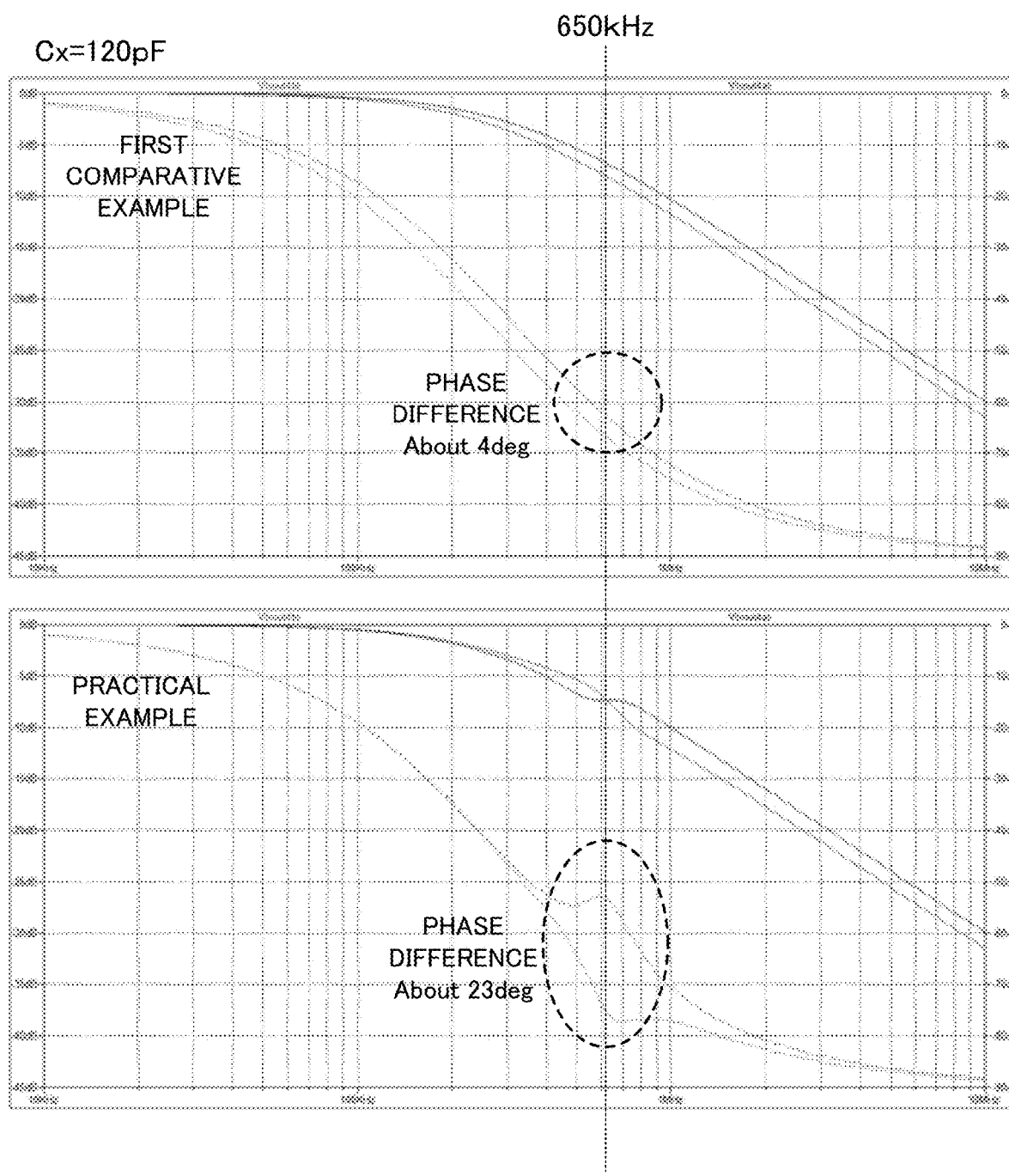
FIG. 9 is version 4 of the graph for comparing frequency characteristics detected in the practical example and the first comparative example.

FIG. 9 illustrates the phase differences of the signals detected in the practical example and the first comparative example when Cx=120 pF. When the frequency fi is 650 kHz, the phase difference detected in the first comparative example is about 4 deg, while the phase difference detected in the practical example is about 23 deg.

As is clear from the aforementioned results, the detected phase difference is significantly increased on the capacitance detection apparatus according to the practical example. It is therefore possible to accurately detect the capacitance even if there is only a small difference between Cx and Cref.

(Set Value of Inductor Lb)

Next, an appropriate set value of the inductor Lb provided on the capacitance detection apparatus according to the practical example will be explained.

In order to appropriately obtain the aforementioned effect, it is ideal that a resonant frequency of Lb and C (which is a series capacitance of Cx and Cref) matches the frequency fi of the signal Vi for detection. Moreover, it is appropriate that Cref (Cr) is set at a central value of an assumed range of Cx, which is a measurement target. It is thus preferable to satisfy a condition of the following equations (26) and (27).

[Equation 16]

$$f_i = \frac{1}{2\cdot\pi\cdot\sqrt{L_b\cdot C}} \quad (26)$$

$$C = \frac{1}{\frac{1}{Cx} + \frac{1}{Cr}} \quad (27)$$

Here, Cx=Cr because the central value of the range of Cx is set as Cref, and C for calculating the resonant frequency is as in the following equation (28).

[Equation 17]

$$C = \frac{Cr}{2} \quad (28)$$

Then, if an appropriate value of Lb is obtained from the equations (26) and (28), the following equation (29) is obtained.

[Equation 18]

$$L_b = \frac{1}{2\cdot\pi^2\cdot Cr\cdot f_i^2} \quad (29)$$

Here, if a setting margin range of Lb is set to be ½ to 2, an appropriate range of Lb is as in the following equation (30).

[Equation 19]

$$\frac{1}{4\cdot\pi^2\cdot Cr\cdot f_i^2} \leq L_b \leq \frac{1}{\pi^2\cdot Cr\cdot f_i^2} \quad (30)$$

Modified Example

Figure 10:
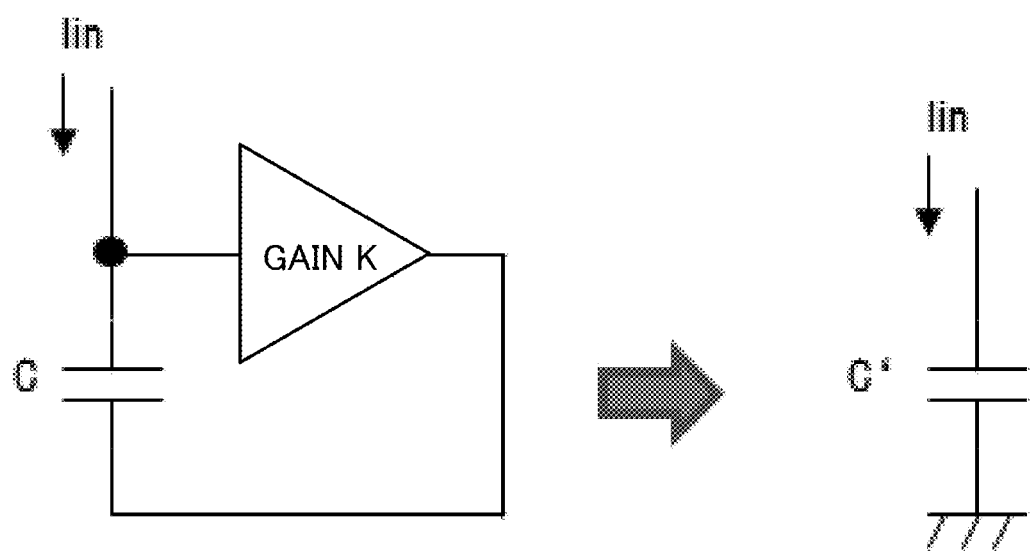
FIG. 10 is a circuit diagram illustrating a configuration of a capacitance value change circuit.
Figure 11:
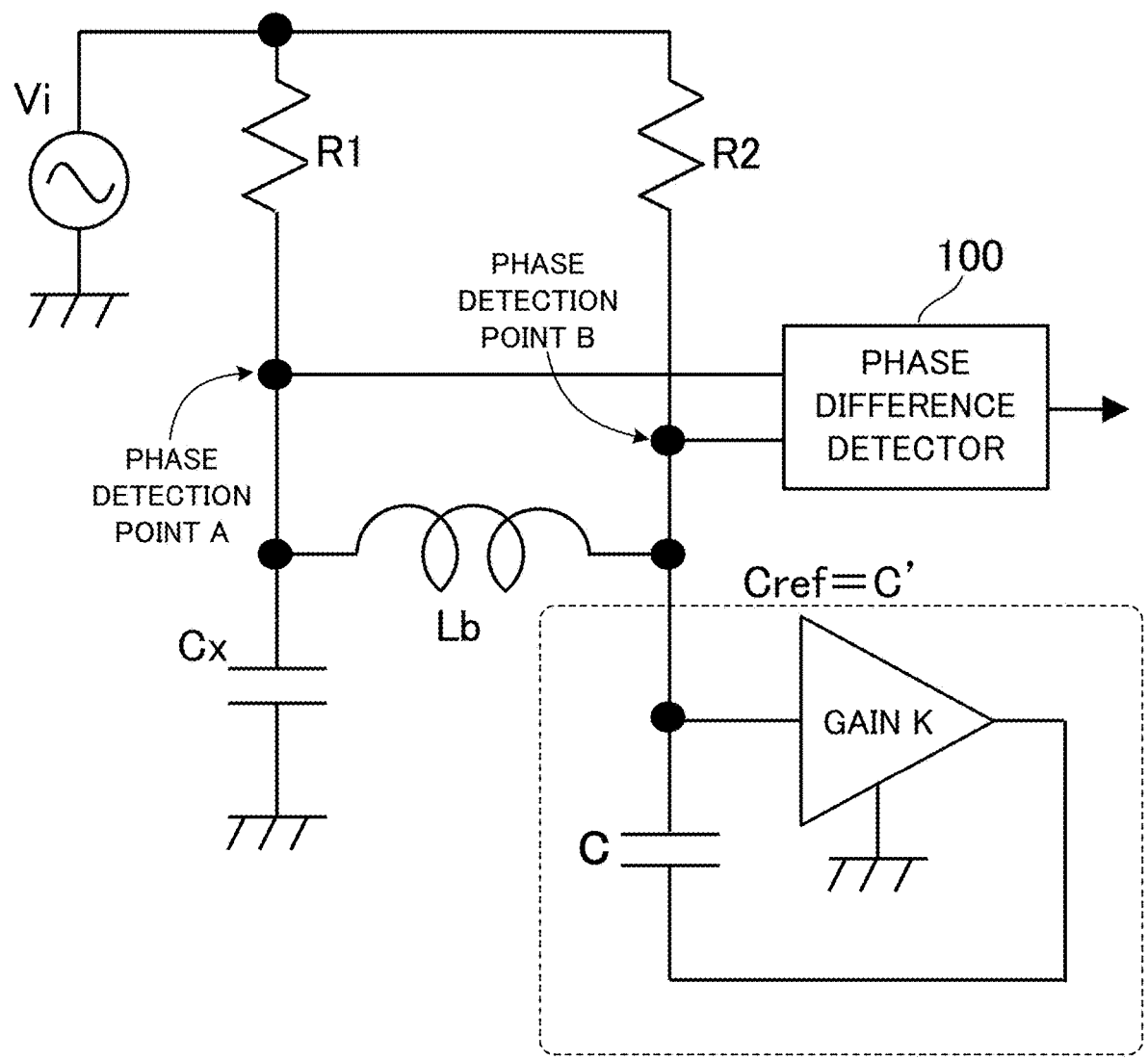
FIG. 11 is a circuit diagram illustrating a configuration of a capacitance detection apparatus according to a modified example.

Next, a capacitance detection apparatus according to a modified example will be explained with reference to FIG. 10 and FIG. 11. FIG. 10 is a circuit diagram illustrating a configuration of a capacitance value change circuit. FIG. 11 is a circuit diagram illustrating a configuration of the capacitance detection apparatus according to the modified example.

As illustrated in FIG. 10, if an amplifier with a gain K is connected to the capacitor C, the capacitor acts like C' in a circuit operation. Here, C' has a value expressed by the following equation (31), wherein K<1.

[Equation 20]

$$C = C \cdot (1-K) \qquad (31)$$

Thus, the use of an amplifier that can control the gain K by using a control voltage from the exterior makes it possible to change the value of C' to a desired value.

The capacitance detection apparatus according to the modified example illustrated in FIG. 11 is configured in such a manner that Cref includes the aforementioned capacitance value change circuit. By virtue of such a configuration, Cref can be changed to have an appropriate value corresponding to Cx if Cx varies in a relatively wide range.

Moreover, not Cref but Cx may include the capacitance value change circuit. In this case, the capacitance of Cx can be changed to have a desired value.

<Optical Wavelength Selective Filter>

Figure 12:
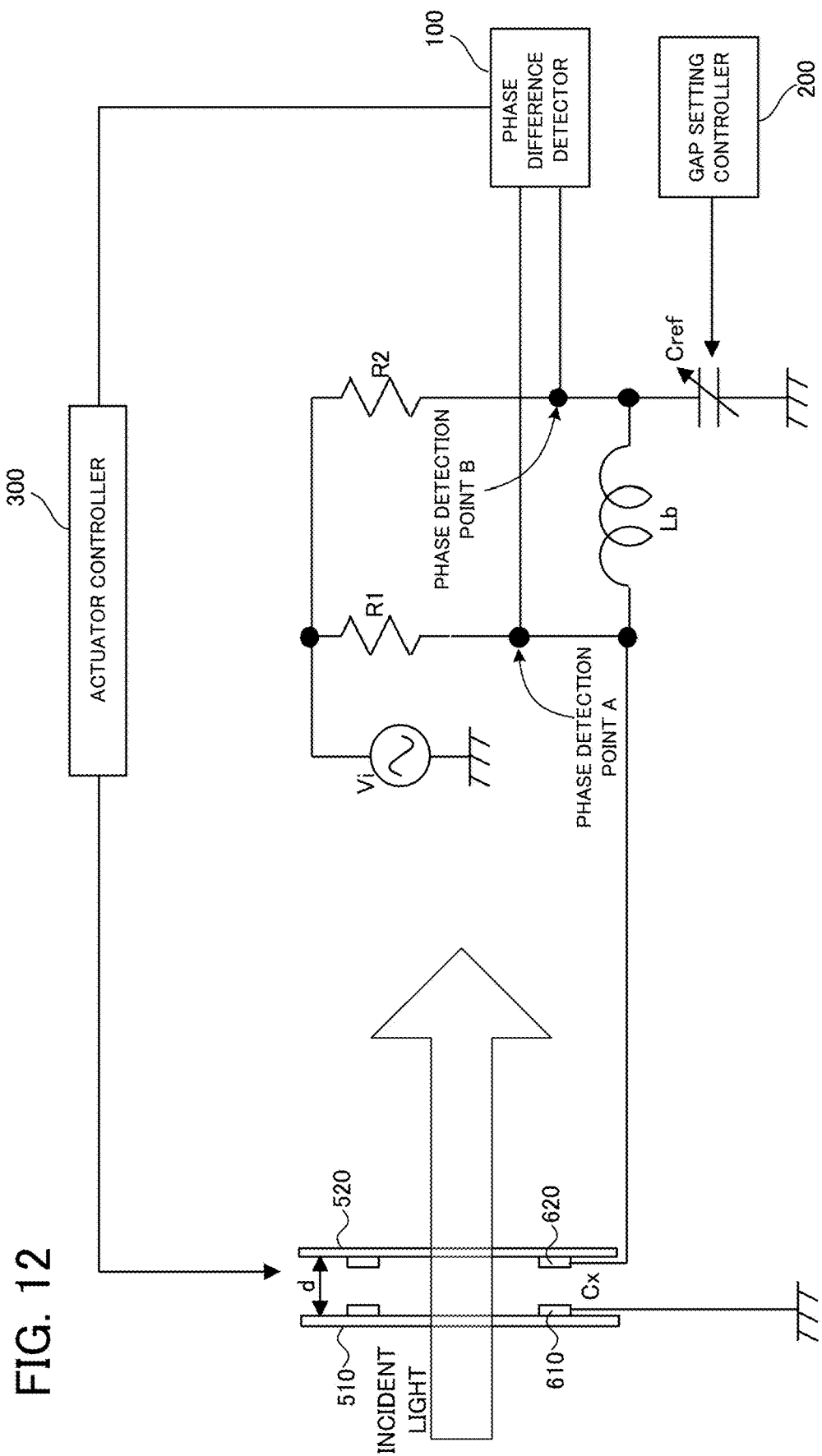
FIG. 12 is a schematic diagram illustrating a configuration of an optical wavelength selective filter according to the practical example.

Next, an optical wavelength selective filter according to the practical example will be explained with reference to FIG. 12. FIG. 12 is a schematic diagram illustrating a configuration of the optical wavelength selective filter according to the practical example.

(Configuration of Apparatus)

In FIG. 12, the optical wavelength selective filter according to the practical example is a Fabry-Perot variable filter, and is configured to change the wavelength of light that passes through a pair of reflective substrates 510 and 520, which have a reflective film on their surface, by adjusting a gap d between the reflective substrates 510 and 520. On the reflective substrates 510 and 520, electrodes 610 and 620 for detection are respectively provided. The capacitance detection apparatus according to the practical example described above is provided in order to detect the capacitance between the electrodes 610 and 620 for detection. In other words, the electrodes 610 and 620 for detection shall be the capacitor Cx of the capacitance detection apparatus.

The capacitance value of the capacitor Cref is variable by the capacitance value change circuit described above. Cref is controlled by a gap setting controller 200.

The phase difference outputted from the phase difference detector 100 is inputted to an actuator controller 300. The actuator controller 300 is configured to drive a not-illustrated actuator on the basis of the inputted phase difference (in other words, the value of Cx). This makes it possible to adjust the gap d between the reflective substrates 510 and 520.

(Explanation of Operation)

According to the optical wavelength selective filter illustrated in FIG. 12, in operation, Cref is controlled to have a value corresponding to a desired gap (i.e., a width corresponding to the wavelength of light to be applied) by the gap setting controller 200.

Next, the gap d is controlled to include the output of the phase difference detector 100 in a predetermined range (i.e., to set the phase difference to be extremely close to zero).

Then, the value of Cx is controlled to approach the value of Cref, and thus, the gap d approaches the value set by the gap setting controller 200. As a result, the gap d can be controlled to a desired value.

As explained above, according to the optical wavelength selective filter according to the practical example, the gap d can be adjusted with high accuracy on the basis of the capacitance. It is therefore possible to change the wavelength of transmitted light.

The present invention is not limited to the aforementioned embodiments and examples, but various changes may be made, if desired, without departing from the essence or spirit of the invention which can be read from the claims and the entire specification. A capacitance detection apparatus and an optical wavelength selective filter apparatus that involve such changes are also intended to be within the technical scope of the present invention.

DESCRIPTION OF REFERENCE NUMERALS AND LETTERS 100 phase difference detector
110, 120 DBM
130 differential amplifier
200 gap setting controller
300 actuator controller
510, 520 reflective substrate
610, 620 detection electrode
Cx, Cref capacitor
R1, R2 resistor
Lb inductor
Vi signal for detection
d gap The invention caimed is:
1. A capacitance detection apparatus comprising:
   a parallel circuit in which a first series circuit and a second series circuit are connected in parallel, wherein a tested body and a first resistance element are connected at a first node in the first series circuit, and a reference capacitance element and a second resistance element are connected at a second node in the second series circuit;
   a power supply circuit configured to apply an alternating current voltage with a specific frequency to said parallel circuit;
   an inductor element connected between the first node and the second node and configured to increase a phase difference in the voltage with the specific frequency between the first and second nodes; and
   an output device configured to output an electric signal corresponding to a capacitance of the tested body on the basis of the phase difference.

2. The capacitance detection apparatus according to claim 1, wherein said output device is configured to output an electric signal indicating a magnitude correlation between the capacitance of the tested body and a capacitance of the reference capacitance element.

3. The capacitance detection apparatus according to claim 1, wherein
   the first resistance element and the second resistance element are pure resistors with the same resistance value,
   said inductor element is a coil element, and
   the reference capacitance element is a capacitor with a known capacitance.

4. The capacitance detection apparatus according to claim 1, wherein the reference capacitance element has a function of varying a value of the capacitance.

5. The capacitance detection apparatus according to claim 1, further comprising an active circuit electrically connected in parallel with the tested body and configured to equivalently increase or reduce the capacitance of the tested body connected to the first node.

6. An optical wavelength selective filter apparatus with a variable extraction wavelength, wherein said optical wavelength selective filter apparatus is configured to output an electric signal corresponding to a capacitance between capacitance detection electrodes, which are respectively placed on a pair of substrates provided with opposing reflective films and which are the tested body, by using the capacitance detection apparatus according to claim 1, and is configured to change a gap between the reflective films on the basis of the electric signal.

* * * * *